(12) United States Patent
Tang et al.

(10) Patent No.: US 10,627,847 B2
(45) Date of Patent: Apr. 21, 2020

(54) BIAS CURRENT CIRCUIT OPERATING AT HIGH AND LOW VOLTAGES

(71) Applicant: Shanghai Huahong Grace Semiconductor Manufacturing Corporation, Shanghai (CN)

(72) Inventors: Chengwei Tang, Shanghai (CN); Xin Wang, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 16/191,763

(22) Filed: Nov. 15, 2018

(65) Prior Publication Data
US 2019/0346873 A1    Nov. 14, 2019

(30) Foreign Application Priority Data
May 10, 2018   (CN) .......................... 2018 1 0443244

(51) Int. Cl.
G05F 3/26    (2006.01)
(52) U.S. Cl.
CPC .................................. *G05F 3/262* (2013.01)
(58) Field of Classification Search
CPC ....................................................... G05F 3/262
See application file for complete search history.

(56) References Cited

U.S. PATENT DOCUMENTS

| | | | | |
|---|---|---|---|---|
| 5,285,168 | A * | 2/1994 | Tomatsu | H03F 3/3001 330/253 |
| 7,554,313 | B1 * | 6/2009 | Leitner | G05F 3/262 323/315 |
| 7,978,005 | B1 * | 7/2011 | Hyde | G05F 3/242 327/538 |
| 2008/0074173 | A1 * | 3/2008 | Tu | G05F 3/26 327/543 |
| 2015/0002131 | A1 * | 1/2015 | Takada | H03F 3/345 323/313 |
| 2015/0194954 | A1 * | 7/2015 | Xu | G05F 3/262 327/537 |

\* cited by examiner

*Primary Examiner* — Fred E Finch, III
*Assistant Examiner* — Rafael O. De León Domenech
(74) *Attorney, Agent, or Firm* — Murtha Cullina LLP

(57) ABSTRACT

A bias current circuit which includes: a main unit including first PMOS and NMOS transistors constituting a first current path, and second PMOS and NMOS transistors constituting a second current path together with a first resistor; an output unit; and a supply voltage adapting unit including a third MOS transistor, a pull-up current source and a pull-down current source. The third MOS transistor is connected between a first node to which gates of the first and second PMOS transistors are connected and a second node to which drains of the second NMOS and PMOS transistors are connected. The pull-up current source is mirrored to the first PMOS transistor and configured to provide a current equal to a current provided by the pull-down current source. The bias current circuit has an operating voltage range encompassing low-voltage band such that it is operable at high and low voltages.

11 Claims, 2 Drawing Sheets

BIAS CURRENT CIRCUIT OPERATING AT HIGH AND LOW VOLTAGES

CROSS-REFERENCE TO RELATED APPLICATION

This application claims the priority of Chinese patent application number 201810443244.5, filed on May 10, 2018, the entire contents of which are incorporated herein by reference.

TECHNICAL FIELD

The present invention relates to a semiconductor integrated circuit (IC) and, in particular, to a bias current circuit.

BACKGROUND

FIG. 1 is a schematic view of a conventional bias current circuit comprising: a first current path formed by connecting a PMOS transistor P1 and a NMOS transistor N1; a second current path formed by connecting a PMOS transistor P2, an NMOS transistor N2 and a resistor R1; and an output path formed of a PMOS transistor P3. The PMOS transistors P1, P2, P3 are connected to form a symmetric structure in which all their sources are connected to a supply voltage VCC and all their gates are connected to a node NET2. A bias current I1 is output from a drain of the PMOS transistor P3.

A drain of the PMOS transistor P1, a drain and a gate of the NMOS transistor N1 and a gate of the NMOS transistor N2 are all connected to a node NET1. A drain of the NMOS transistor N2 is connected to the node NET2.

A source of the NMOS transistor N1 is grounded, and the resistor R1 is connected between a source of the NMOS transistor N2 and the ground.

The bias current circuit of FIG. 1 can well operate when the supply voltage VCC is high. However, with the increasing popularity of handheld devices, more and more low-voltage and low-power applications are emerging, which pose a challenge because they require the existing bias current circuits in various analog circuits to be also able to well operate at lower supply voltages (e.g., the supply voltage VCC in FIG. 1). As known from FIG. 1, the operation of the circuit requires a voltage drop from the supply voltage VCC to the node NET2 that is higher than a threshold voltage of the PMOS transistor P1, as well as a voltage at the node NET1 that is higher than a threshold voltage of the NMOS transistor N1. Therefore, a decrease in the supply voltage VCC means lower voltages at the nodes NET1 and NET2, which may create a possibility of the voltage drop from the supply voltage VCC to the node NET2 and the voltage at the node NET1 approaching or even dropping below the threshold voltages of the corresponding PMOS transistor and the corresponding NMOS transistor, respectively. When this happens, the performance of the circuit will be impaired.

SUMMARY OF THE INVENTION

It is an object of the present invention to provide a bias current circuit with an operating voltage range expanded to also cover a low-voltage band so that the circuit is operable at both high and low voltages.

To this end, a bias current circuit provided in the present invention includes a bias current main unit, an output unit and a supply voltage adapting unit.

The bias current main unit includes a first PMOS transistor, a second PMOS transistor, a first NMOS transistor, a second NMOS transistor and a first resistor.

The first PMOS transistor and the second PMOS transistor have their respective gates both connected to a first node and the first PMOS transistor and the second PMOS transistor are mirrored to each other.

The first and second PMOS transistors have their respective sources both connected to a supply voltage.

The first NMOS transistor has a drain connected to a drain of the first PMOS transistor and a source that is grounded.

The second NMOS transistor has a drain connected, along with a drain of the second PMOS transistor, to a second node and a source connected to a first end of the first resistor, and a second end of the first resistor is grounded.

The first NMOS transistor and the first PMOS transistor constitute a first current path, and the first resistor, the second NMOS transistor and the second PMOS transistor constitute a second current path.

The output unit is mirrored to the first PMOS transistor and configured to output a bias current.

The supply voltage adapting unit includes a third MOS transistor, a pull-up current source and a pull-down current source.

The third MOS transistor has a first terminal connected to the first node, a second terminal connected to the second node and a third terminal which is a gate and is connected to an electric potential that maintains the third MOS transistor in an ON state.

The pull-up current source is mirrored to the first PMOS transistor, and the pull-down current source is configured to provide a current that is equal in magnitude to a current provided by the pull-up current source.

The pull-up current source is connected to the second node, and the pull-down current source is connected to the first node. The current from the pull-up current source is entirely fed into the third MOS transistor via the second node due to the current provided by the pull-up current source being equal in magnitude to the current provided by the pull-down current source.

Upon a decrease in the supply voltage, the pull-down current source may pull down a voltage at the first node such that the voltage at the first node is lower than a voltage at the second node, resulting in an increase in a source-drain voltage between the first and second terminals of the third MOS transistor. The lowered voltage at the first node is favorable to the performance of the first and second PMOS transistors.

According to a more preferred embodiment, the third MOS transistor is a PMOS transistor. The first terminal of the third MOS transistor is a drain, the second terminal of the third MOS transistor is a source and the third terminal of the third MOS transistor is grounded.

According to a more preferred embodiment, the pull-up current source is composed of a fourth PMOS transistor having a source connected to the supply voltage, a gate connected to the first node and a drain connected to the second node.

According to a more preferred embodiment, the pull-down current source is composed of a third NMOS transistor having a source grounded, a drain connected to the first node and a gate connected to a bias voltage that makes the current from the pull-down current source equal in magnitude to the current from the pull-up current source.

According to a more preferred embodiment, the bias voltage at the gate of the third NMOS transistor is provided by a third current path comprising a first mirror circuit mirrored to the fourth PMOS transistor and a second mirror circuit mirrored to the third NMOS transistor, the first and second mirror circuits configured to provide currents equal in magnitude and the first and second mirror circuits connected together to form the third current path.

According to a more preferred embodiment, a ratio of the current from the first mirror circuit to the current from the pull-up current source is equal to a ratio of the current from the second mirror circuit to the current from the pull-down current source.

According to a more preferred embodiment, the current from the first current path is equal to the current from the second current path.

According to a more preferred embodiment, the current from the pull-up current source is lower than the current from the first current path.

According to a more preferred embodiment, the first mirror circuit is composed of a fifth PMOS transistor having a source connected to the supply voltage, a drain connected to the second minor circuit and a gate connected to the first node.

According to a more preferred embodiment, the second mirror circuit is composed of a fourth NMOS transistor having a source grounded, a drain connected to the first minor circuit and a gate connected to the gate of the third NMOS transistor.

According to a more preferred embodiment, the output unit is composed of a sixth PMOS transistor having a source connected to the supply voltage, a gate connected to the first node and a drain outputting the bias current.

According to the present invention, the third MOS transistor in the supply voltage adapting unit, which is disposed between the first node to which the gates of the first and second PMOS transistors in the main unit is connected and the second node to which the drains of the second NMOS transistor and the second PMOS transistor in the main unit are connected, is connected at its two terminals respectively to the pull-up and pull-down current sources providing equal currents. These sources can adapt the voltage difference between the first and second nodes, i.e., the source-drain voltage of the third MOS transistor, to the magnitude of the supply voltage, without affecting the current in the main unit. As a result, when the supply voltage is low, a voltage difference between the first and second nodes increases because of a decrease in the voltage at the first node, which causes the voltage at the first node to be lower than the voltage at the second node. The reduced voltage at the first node will increase a gate-source voltage of the first PMOS transistor, which is favorable to the performance of the first and second PMOS transistors. Thus, the bias current circuit of the present invention can operate well at the low voltage, i.e., having an operating voltage range expanded to cover a low voltage band.

Further, when the supply voltage is high, the source-drain voltage of the third MOS transistor is nearly zero, which is equivalent to connecting together the first and second nodes. As a result, the circuit is structurally similar to the conventional circuits and thus operates well at the high voltage. Therefore, the bias current circuit of the present invention can operate in a satisfactory manner at both high and low voltages.

BRIEF DESCRIPTION OF THE DRAWINGS

The present invention will be described in greater detail below with reference to the accompanying drawings which illustrates some specific embodiments of the invention.

DETAILED DESCRIPTION

Figure 1:
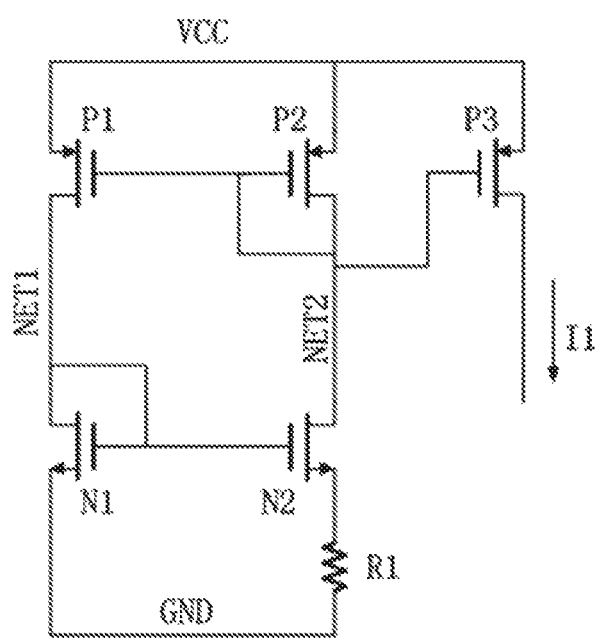
FIG. 1 is a schematic view of a conventional bias current circuit.
Figure 2:
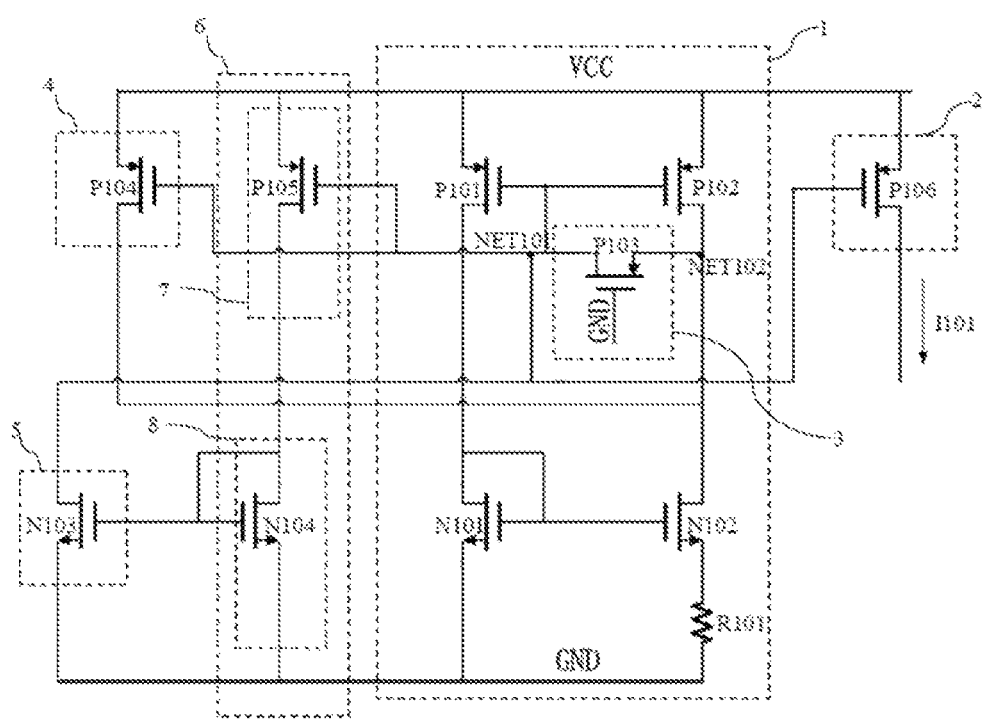
FIG. 2 is a schematic view of a bias current circuit according to an embodiment of the present invention.

FIG. 2 is a schematic view of a bias current circuit according to an embodiment of the present invention, including a bias current main unit 1, an output unit 2 and a supply voltage adapting unit.

The bias current main unit 1 includes a first PMOS transistor P101, a second PMOS transistor P102, a first NMOS transistor N101, a second NMOS transistor N102 and a first resistor R101.

A gate of each of the first and second PMOS transistors P101, P102 is connected to a first node NET101, and the first and second PMOS transistors P101, P102 are mirrored to each other.

A source of each of the first and second PMOS transistors P101, P102 is connected to a supply voltage VCC.

A drain of the first NMOS transistor N101 is coupled to a drain of the first PMOS transistor P101, and a source of the first NMOS transistor N101 is connected to the ground GND.

A drain of each of the second NMOS and PMOS transistors N102, P102 is connected to a second node NET102. A source of the second NMOS transistor N102 is connected to a first end of the first resistor R101, and a second end of the first resistor R101 is connected to the ground GND.

The first NMOS and PMOS transistors N101, P101 constitute a first current path, and the first resistor R101 and the second NMOS and PMOS transistors N102, P102 constitute a second current path.

The output unit 2 is mirrored to the first PMOS transistor P101 and configured to output a bias current 1101.

The supply voltage adapting unit includes a third MOS transistor 3, a pull-up current source 4 and a pull-down current source 5.

The third MOS transistor 3 has a first terminal connected to the first node NET101, a second terminal connected to the second node NET102 and a third terminal which is a gate terminal connected to an electric potential that maintains the third MOS transistor 3 in an "ON" state.

The pull-up current source 4 is mirrored to the first PMOS transistor P101, and the pull-down current source 5 is configured to provide a current that is equal in magnitude to a current provided by the pull-up current source 4.

The pull-up current source 4 is connected to the second node NET102, and the pull-down current source 5 is connected to the first node NET101. Due to the same magnitude of the currents respectively provided by the pull-up and pull-down current sources 4, 5, the current from the pull-up current source 4 is entirely fed into the third MOS transistor 3 via the second node NET102.

Upon a decrease in the supply voltage VCC, the pull-down current source 5 pulls down a voltage at the first node NET101 so that the latter is lower than a voltage at the second node NET102. As a result, a source-drain voltage between the first and second terminals of the third MOS transistor 3 is increased. The decrease in the voltage at the first node NET101 is favorable to the performance of the first and second PMOS transistors P101, P102.

In an embodiment of the present invention, the third MOS transistor 3 is a third PMOS transistor P103. A first terminal of the third MOS transistor is a drain, a second terminal of the third MOS transistor is a source and a third terminal of the third MOS transistor is connected to the ground GND.

The pull-up current source 4 is composed of a fourth PMOS transistor P104 having a source connected to the supply voltage VCC, a gate connected to the first node NET101 and a drain connected to the second node NET102.

The pull-down current source 5 is composed of a third NMOS transistor N103 having a source connected to the ground GND, a drain connected to the first node NET101 and a gate connected to a bias voltage that makes the current from the pull-down current source 5 equal in magnitude to the current from the pull-up current source 4.

The bias voltage at the gate of the third NMOS transistor N103 is provided by a third current path 6 comprised of a first mirror circuit 7 mirrored to the fourth PMOS transistor P104 and a second mirror circuit 8 mirrored to the third NMOS transistor N103. The first and second mirror circuits 7, 8 are configured to provide equal currents and are connected together to form the third current path 6. A ratio of the current from the first mirror circuit 7 to the current from the pull-up current source 4 is equal to a ratio of the current from the second mirror circuit 8 to the current from the pull-down current source 5.

In an embodiment of the present invention, the first mirror circuit 7 is composed of a fifth PMOS transistor P105 having a source connected to the supply voltage VCC, a drain connected to the second mirror circuit 8 and a gate connected to the first node NET101.

In addition, the second mirror circuit 8 is composed of a fourth NMOS transistor N104 having a source connected to the ground GND, a drain connected to the first mirror circuit 7 and a gate connected to the gate of the third NMOS transistor N103.

In an embodiment of the present invention, the current from the first mirror circuit 7 is equal to the current from the pull-up current source 4, and the current from the first current path is equal to the current from the second current path.

Additionally, the current from the pull-up current source 4 is lower than the current from the first current path.

Moreover, the output unit 2 is composed of a sixth PMOS transistor P106 having a source connected to the supply voltage VCC, a gate connected to the first node NET101 and a drain outputting the bias current 1101.

According to embodiments of the present invention, the third MOS transistor 3 in the supply voltage adapting unit, which is disposed between the first and second nodes NET101, NET102 in the bias current main unit 1, is connected at its two terminals respectively to the pull-up and pull-down current sources 4, 5 providing equal currents. The sources 4, 5 can adapt the voltage difference between the first and second nodes NET101, NET102, i.e., the source-drain voltage of the third MOS transistor 3, according to the magnitude of the supply voltage VCC, without affecting the current in the bias current main unit 1. The adaptation includes increasing the voltage difference between the first and second nodes NET101, NET102 when the supply voltage VCC is low. This leads to a decrease in the voltage at the first node NET101 and hence to an increase gate-source voltage of the first PMOS transistor P101, which is favorable to the performance of the first and second PMOS transistors P101, P102. Thus, the bias current circuit according to the embodiments of the present invention can operate well at the low voltage, i.e., having an operating voltage range expanded to cover a low voltage band.

Further, when the supply voltage VCC is high, the source-drain voltage of the third MOS transistor 3 is nearly zero, which is equivalent to connecting together the first and second nodes NET101, NET102. As a result, the circuit is structurally similar to the conventional circuits and thus operates well at the high voltage. Therefore, the bias current circuit according to the embodiments of the present invention can satisfactorily operate at both high and low voltages.

While the invention has been described above with reference to several preferred embodiments, its scope is in no way limited to these embodiments. Any and all changes and modifications made by those of ordinary skill in the art based on the above teachings fall within the scope as defined in the appended claims.

What is claimed is:

1. A bias current circuit comprising a bias current main unit, an output unit and a supply voltage adapting unit, the bias current main unit comprising a first PMOS transistor, a second PMOS transistor, a first NMOS transistor, a second NMOS transistor and a first resistor, the first PMOS transistor having a gate connected to a gate of the second PMOS transistor, the first and second PMOS transistors being mirrored to each other, the first and second PMOS transistors having sources both connected to a supply voltage, the first NMOS transistor having a drain connected to a drain of the first PMOS transistor and a source that is grounded, the second NMOS transistor having a drain connected to a drain of the second PMOS transistor and a source connected to a first end of the first resistor, a second end of the first resistor being grounded, the first NMOS transistor and the first PMOS transistor constituting a first current path, the first resistor, the second NMOS transistor and the second PMOS transistor constituting a second current path, the output unit is composed of a sixth PMOS transistor that is mirrored to the first PMOS transistor, the sixth PMOS transistor having a source connected to the supply voltage, a gate coupled to the gate of the first PMOS transistor and a drain configured to output a bias current, the supply voltage adapting unit comprising a third MOS transistor, a pull-up current source and a pull-down current source, the third MOS transistor having a first terminal coupled to the gate of the first PMOS transistor and the gate of the sixth PMOS transistor, a second terminal coupled to the drain of the second PMOS transistor, and a third terminal which is a gate and is connected to an electric potential that maintains the third MOS transistor in an ON state, wherein the first terminal of the third MOS transistor is not coupled to the drain of the first PMOS transistor, the pull-up current source mirrored to the first PMOS transistor, the pull-down current source configured to provide a current that is equal in magnitude to a current provided by the pull-up current source, the pull-up current source connected to the second terminal of the third MOS transistor, the pull-down current source connected to the first terminal of the third MOS transistor, wherein the current from the pull-up current source is entirely fed into the third MOS transistor via the second terminal of the third MOS transistor due to the current provided by the pull-up current source being equal in magnitude to the current provided by the pull-down current source.

2. The bias current circuit of claim 1, wherein upon a decrease in the supply voltage, the pull-down current source pulls down a voltage at the first terminal of the third MOS transistor such that the voltage at the first node is lower than a voltage at the second terminal of the third MOS transistor, resulting in an increase in a source-drain voltage between the first and second terminals of the third MOS transistor.

3. The bias current circuit of claim 1, wherein the third MOS transistor is a third PMOS transistor, the first terminal of the third MOS transistor being a drain, the second terminal of the third MOS transistor being a source, the third terminal of the third MOS transistor being grounded.

4. The bias current circuit of claim 1, wherein the pull-up current source is composed of a fourth PMOS transistor having a source connected to the supply voltage, a gate connected to the first terminal of the third MOS transistor and a drain connected to the second terminal of the third MOS transistor.

5. The bias current circuit of claim 4, wherein the pull-down current source is composed of a third NMOS transistor having a source grounded, a drain connected to the first terminal of the third MOS transistor and a gate connected to a bias voltage that makes the current from the pull-down current source equal in magnitude to the current from the pull-up current source.

6. The bias current circuit of claim 5, wherein the bias voltage at the gate of the third NMOS transistor is provided by a third current path comprising a first mirror circuit mirrored to the fourth PMOS transistor and a second mirror circuit mirrored to the third NMOS transistor, the first and second mirror circuits configured to provide currents equal in magnitude, the first and second mirror circuits connected together to form the third current path.

7. The bias current circuit of claim 6, wherein a first ratio of the current from the first mirror circuit to the current from the pull-up current source is equal to a second ratio of the current from the second mirror circuit to the current from the pull-down current source.

8. The bias current circuit of claim 7, wherein the current from the first current path is equal to the current from the second current path.

9. The bias current circuit of claim 8, wherein the current from the pull-up current source is lower than the current from the first current path.

10. The bias current circuit of claim 6, wherein the first mirror circuit is composed of a fifth PMOS transistor having a source connected to the supply voltage, a drain connected to the second mirror circuit and a gate connected to the first terminal of the third MOS transistor.

11. The bias current circuit of claim 6, wherein the second mirror circuit is composed of a fourth NMOS transistor having a source grounded, a drain connected to the first mirror circuit and a gate connected to the gate of the third NMOS transistor.

\* \* \* \* \*